(12) United States Patent
Kamath (10) Patent No.: US 7,737,747 B2
(45) Date of Patent: Jun. 15, 2010

(54) SCHEME FOR CONTROLLING RISE-FALL TIMES IN SIGNAL TRANSITIONS

(75) Inventor: Anant Shankar Kamath, Kamataka (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/848,241

(22) Filed: Aug. 31, 2007

(65) Prior Publication Data

US 2009/0058480 A1 Mar. 5, 2009

(51) Int. Cl.
*H03K 5/12* (2006.01)

(52) U.S. Cl. .................. 327/170; 327/283; 327/284; 327/263; 327/268

(58) Field of Classification Search .......... 327/170, 327/108–112, 263–272, 283–290; 326/83, 326/82, 22, 23
See application file for complete search history.

(56) References Cited

U.S. PATENT DOCUMENTS

| | | | | |
|---|---|---|---|---|
| 3,940,635 | A * | 2/1976 | Meyer | 327/105 |
| 6,281,715 | B1 | 8/2001 | DeClue et al. | |
| 6,573,778 | B2 * | 6/2003 | Salome et al. | 327/310 |
| 6,628,150 | B1 | 9/2003 | Carvajal et al. | |

OTHER PUBLICATIONS

5Gbps Serial Link Transmitter with Pre-emphasis. Chih-Hsien Lin et al. IEEE 2003. This paper can be found in this location: http://ieeexplore.ieee.org/iel5/8504/26878/01195127.pdf.

* cited by examiner

*Primary Examiner*—Lincoln Donovan
*Assistant Examiner*—Brandon S Cole
(74) *Attorney, Agent, or Firm*—Wade J. Brady, III; Frederick J. Telecky, Jr.

(57) ABSTRACT

A serial interface interacting with a transmission pad system circuitry wherein a differential impedance is reckoned across the system voltage source, includes a scheme for controlling transmitter rise-fall transitions (to selectively speed up or slow down transitions) without requiring additional timing controls or affecting reflection coefficient of the transmitter port. The scheme uses at least one pre-charged capacitor, e.g., PMOS capacitor, interacting with the transmitter pad and connected through resistances or otherwise across the differential impedance with a switch. A modified scheme uses first and second parallely connected PMOS capacitors connectable with the transmission pad by switches, which may be NMOS switches. The scheme may be used in a MIPI D-PHY compliant DSI transmitter operating at, for e.g. 800 Mbps, and low signal common-modes. The scheme controls signal transition times of high speed circuitry including transmitters and uses a DATA signal which is already available to the circuitry.

20 Claims, 7 Drawing Sheets

SCHEME FOR CONTROLLING RISE-FALL TIMES IN SIGNAL TRANSITIONS

FIELD OF THE INVENTION

This invention relates generally to improvements in the design of high speed signal circuitry such as for example, serial interfaces, and more particularly to a scheme for controlling the rise and fall times of the signal transitions in circuitry such as in serial interfaces.

BACKGROUND OF THE INVENTION

In high speed signal circuitry such as transmitters which might be used with serial interfaces, it is desirable to have controlled rise/fall times for output transitions. Very fast transitions cause EMI (Electro Magnetic Interference) and very slow transitions result in poor receiver performance.

The rise and fall times at the transmitter pad are determined by: the output impedance of the driver, the characteristic impedance of the transmission line and the total lumped capacitance on the pad. The rise and fall times can be represented by simple RC charge and discharge. (Herein, the word capacitance is written abbreviated sometimes as "cap").

Figure 1:
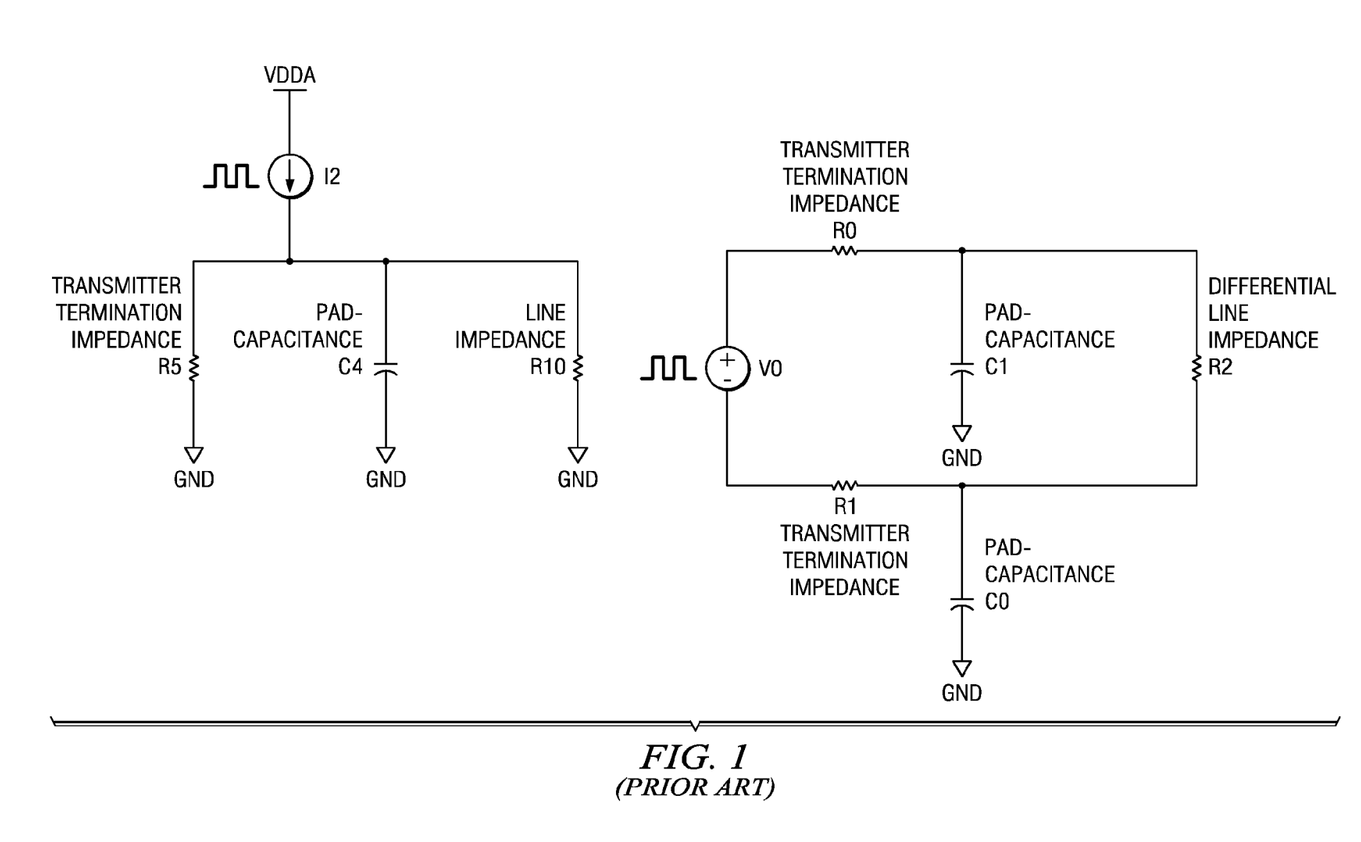
FIG. 1 illustrates exemplary first order RC rise/fall times in current mode and voltage mode transmitters.

FIG. 1 shows a prior art type of current mode driver and a voltage mode driver in the context of a transmitter pad. It is noted in the context of FIG. 1 that the rise-fall times, as shown by way of example are first order RC.

The output impedance of the driver of the transmitter is generally matched with the characteristic impedance of the line, for design purposes. The value of each impedance is determined by factors such as transmission line design, output voltage swing, and dc power consumption. Typically and as an example, both the impedances may be of the order of 50 Ohms. In some cases they may be of the order of 100 Ohms. In some current mode drivers, the termination impedance may be chosen to be much larger than the line impedance, in order to save power. The transitions are still an RC phenomenon, but they are now controlled by the line impedance more than the transmitter termination impedance.

Once the line impedance is known, the total capacitance on the pad is one parameter with which to control the rise and fall times. In some applications, especially at high data rates, it is desirable to keep the pad capacitance to a minimum so as to prevent reflections at high frequencies. In such cases the rise/fall times become very small, and a method is required to increase the transition times. In some other applications, there might be too much pad capacitance on the pads, owing to high-capacitance ESD structures or the self-capacitance of other transmitters and receivers sharing the same pads. In such cases, the rise/fall times are very large and the transition times need to be reduced.

Figure 2:
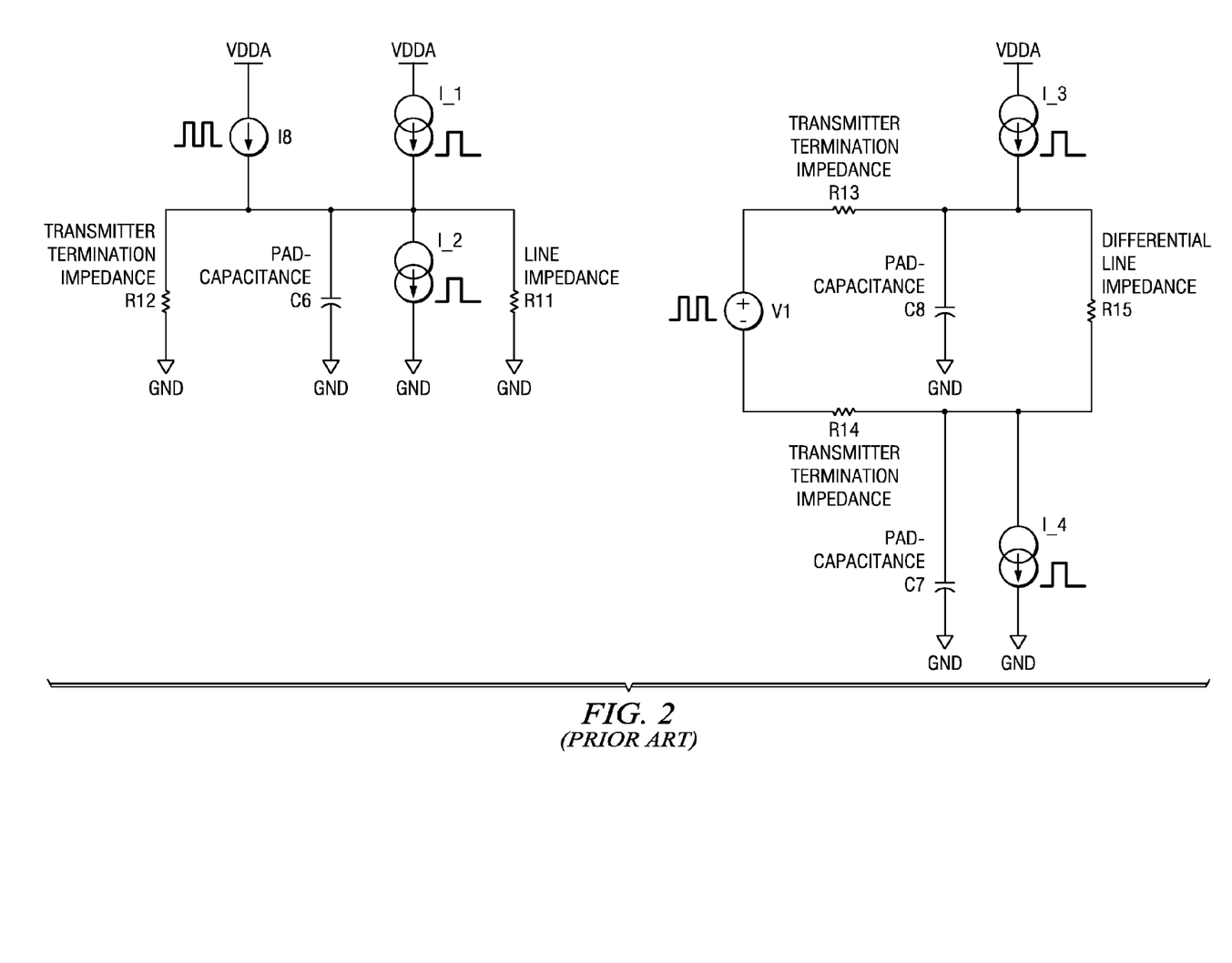
FIG. 2 illustrates a prior art approach using current pulses to speed up/slow down transition times.

In prior art, often short duration current pulses (lasting a fraction of the transition time, for example) are used to either slow down or speed up transitions. In known art, current sources provide extra charge which helps either to speed up or slow down the transition. Such a prior art scheme is shown in FIG. 2. There are two disadvantages to the prior art scheme shown in FIG. 2. First, the width of the current pulse needs to be controlled. This implies generating an accurate timing which is a small fraction of the data rate itself, which is a difficult and jitter-prone proposition at high data rates. Second, for low voltage swing, low common mode applications (and these are becoming increasingly popular) the current sources which sink current ($I\_2$ and $I\_4$) will not have enough voltage headroom.

A design example addressing the problems referenced in the previous paragraphs is presented in the present and the next paragraph in the context of MIPI D-PHY standard. As known, MIPI D-PHY standard is a PHY standard for serial interfaces used in mobile phones. Examples of such include camera and display system applications conveying data between the cell phone processor chip and display or camera chips. MIPI D-PHY standard requires a voltage mode driver with 50 Ohm single-ended impedance. The common-mode is 200 mV and the differential swing is ±100 mV on top of the common mode. Stringent high-frequency reflection requirements translate to a max capacitance limit on the pad=1.5 pF (see FIG. 3). The minimum rise time (20% to 80% of dc value) allowed is 150 ps. A simple RC across process variation gives the worst case, minimum rise time of 70 ps. In such a case, the nominal value of time constant=(50||50)*1.5 pf=30 ps and around two time constants are required for a 20%-80% charging. Hence a scheme to slow-down transmission times is required.

Figure 3:
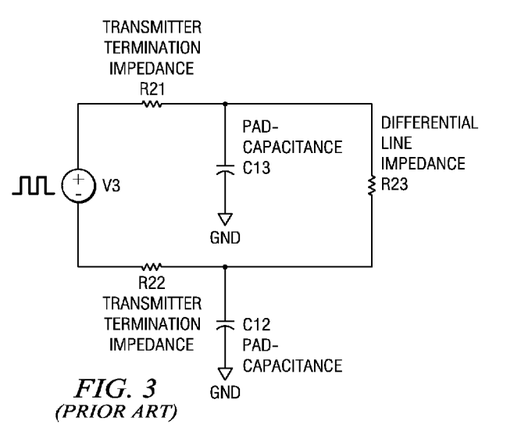
FIG. 3 shows a MIPI D-PHY transmitter diagram, showing exemplary voltage levels while driving "1"

FIG. 3 is a design example addressing problems referenced above and illustrates a MIPI D-PHY transmitter showing the line state when the transmitter is driving a differential '1'. The voltage levels, with 100 mV minimum, offer too less of a voltage head-room with which to design low capacitance current sources. The scheme based on current pulses will be difficult to design. Also, generating accurate pulses with width in 10 s of pico-seconds is a difficult and costly proposition.

An improved scheme is required to control transmitter rise-fall times for a serial interface without requiring additional timing or dedicated additional current pulses. Such improved scheme also needs to work for low common mode, low differential swing applications.

SUMMARY OF THE INVENTION

The present invention provides an improved scheme to control rise-fall times in circuitry such as transmitters associated with a serial interface pad, without requiring additional timing. The present improved scheme also works for low common mode, low differential swing applications. In one form, the invention resides in method in a transmitter pad system using a transmitter voltage source and interacting with a serial interface of the type using a voltage/current mode driver wherein a line-impedance exists across the transmitter voltage source, the method being for controlling transmitter rise-fall transitions to selectively speed up or slow down transitions and comprising: using at least one pre-charged capacitor connected through resistor-like elements and switches across the line-impedance to cooperate with the transmitter pad system to selectively speed up or slow down transitions. For the purposes of this invention, "pre-charged capacitor" is to be understood to mean a capacitor or similar element pre-charged to a suitable voltage. The present method can also be used to control rise-fall times in circuitry other than circuitry involving transmitters, e.g., internal to a chip, and especially for serial interface output transition control. It is noted that the voltage developed across the capacitor during the pre-charging phase enables it to provide an opposing current in the discharging phase. The resistor-like elements referred to in this paragraph might be resistors per se, or other circuitry which behaves like resistors and has an equivalent resistance. Such other circuitry is known to those skilled in the art.

In a second form, the invention resides in a scheme, in a transmitter pad system circuitry using a serial interface of the type conforming to MIPI D-PHY standard wherein the transmitter circuitry includes a voltage source and has a differential impedance existing across said voltage source, the scheme being configured for controlling transmitter rise-fall transitions without requiring additional timing controls and comprising: at least one pre-charged capacitor controlled with a switch interacting with the transmitter pad and connected across the differential impedance for selectively speeding up or slowing down said transmitter rise-fall transitions.

In another form, the invention resides in a scheme in a serial interface system arrangement conforming to D-PHY standard and used with a transmitter pad, wherein the transmitter pad is connected across a voltage source and is influenced by a differential line impedance reckoned across the voltage source, the scheme being for controlling transmitter rise-fall transitions, comprising: providing a first current path having a first controllable switch and including a first PMOS capacitor; and, providing a second current path having a second controllable switch and including a second PMOS capacitor, the first and second PMOS capacitors being connected in parallel across said voltage source through resistors, the scheme additionally being configured such that when said first PMOS capacitor is connected for one transition, the second PMOS capacitor is connected between a suitable voltage supply and ground for getting pre-charged, and vice versa. It is to be understood herein that where resistors are used for connection of elements and capacitors, the resistors may be replaced without limitation by circuits or other elements which exhibit equivalent resistance.

The controllable switch could take the form of a NMOS switch controlled by CMOS digital levels. The invention may be implemented for example in a MIPI D-PHY compliant DSI transmitter operating at 800 Mbps, for example.

BRIEF DESCRIPTION OF THE DRAWING

A detailed understanding of the invention may be had from the following description of exemplary embodiments, to be understood in conjunction with the accompanying drawing wherein.

DETAILED DESCRIPTION

A detailed description of one or more embodiments of the invention is provided below in the context of the accompanying figures that illustrate by way of example the principles of the invention. While the invention is described in connection with such embodiments, it should be understood that the invention is not limited to any embodiment. On the contrary, the scope of the invention is limited only by the appended claims and the invention encompasses numerous alternatives, modifications and equivalents. For the purpose of example, numerous specific details are set forth in the following description in order to provide a thorough understanding of the present invention.

The present invention may be practiced according to the claims without some or all of these specific details. For the purpose of clarity, technical material that is known in the technical fields related to the invention has not been described in detail so that the crux of the present invention is not unnecessarily obscured.

Described herein are examples embodying an improved scheme and a method to control rise-fall times, for example, at a transmitter serial interface pad, without the need for additional timing. As aforesaid, the scheme and the method can be applied to control rise-fall times of circuitry other than in transmitters. The present exemplary improved scheme also works for low common mode, low differential swing applications. Expediently, one form of the invention as illustrated provides a scheme in a serial interface pad system arrangement conforming to D-PHY standard, wherein a transmitter pad is connected across a voltage source and uses a differential line impedance existing across the voltage source, wherein the scheme is configured and provided for controlling transmitter rise-fall transitions. The scheme might take the form of providing a single pre-charged capacitor connected through resistors across the differential line impedance with a controllable switch. Alternatively, the scheme may take the form of providing parallely connected first and second current paths connected across the differential line impedance, the first current path having a first controllable switch and including a first PMOS pre-charged capacitor, and, the second current path having a second controllable switch and including a second PMOS pre-charged capacitor.

Figure 4:
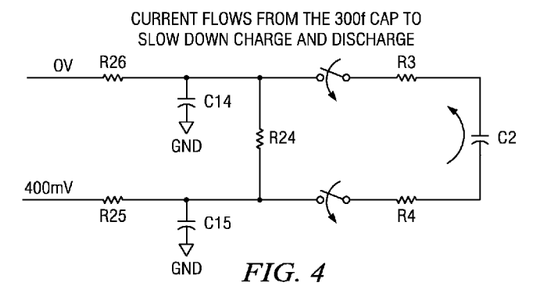
FIG. 4 illustrates an exemplary embodiment of the proposed scheme with a regular capacitor deployed.

FIG. 4 shows an example of the concept of the proposed scheme. As shown in FIG. 4, a small capacitor ($C_2$) pre-charged to 1.2 V and connected through resistors and switches, is deployed across the transmitter pad. The pre-charging voltage is chosen for example, to be 1.2V (1.2V being chosen since 1.2V is the available supply) through resistors in such a way that it pumps charge into the node that is trying to discharge and takes away charge from the node that is trying to charge, thus effectively slowing down the transition. Other suitable voltages for pre-charging the capacitor may be used instead. The current taken away from one node is automatically ensured to be equal to the current pumped into the other node. This ensures differential behavior, and, the common mode does not change during transition.

FIG. 4 further shows the initial conditions (IC) at the beginning of a 1 to 0 transition. The source voltages for example are 0 and 400 mV. The pad voltages for example are 300 mV and 100 mV. Preferably, the pad voltages need to change to 100 mV and 300 mV respectively. When the capacitance $C_2$ which is initially charged to 1.2V is connected across the pad, its terminal voltages change instantaneously to 800 mV and −400 mV respectively. The final condition after the transition will be reflected by pad voltages 100 mV and 300 mV respectively. Voltage across the capacitance at the end of the transition=−200 mV.

A current caused by discharge of the capacitor (which for example may be the equivalent of 1.2V/400=3 mA) flows into the pad that is trying to discharge and flows out of the pad that is trying to charge. This current opposes the 6 mA currents flowing from the 400 mV voltage source and the 6 mA flowing to ground. Thus the transition is slowed down. An opposing current continues to flow till the capacitance $C_2$ is fully discharged. All values of voltages and currents stated in this paragraph and the preceding two paragraphs are with reference to a sample implementation according to the MIPI-D PHY standard. The voltages and currents referred to are not intended to be limiting and are presented as examples for a clearer understanding of the invention.

The preceding three paragraphs discuss exemplary means to slow down transitions. However, it should be noted that if the capacitance is connected in a way to pump current into the node charging up (instead of the node pad discharging as discussed supra) the transition can be speeded up.

After $C_2$ fully discharges it remains connected to the pad, but does not degrade the high frequency reflection because of two reasons:

1. It is isolated through a series resistance and,
 2. The value of the capacitance is small.

Figure 5:
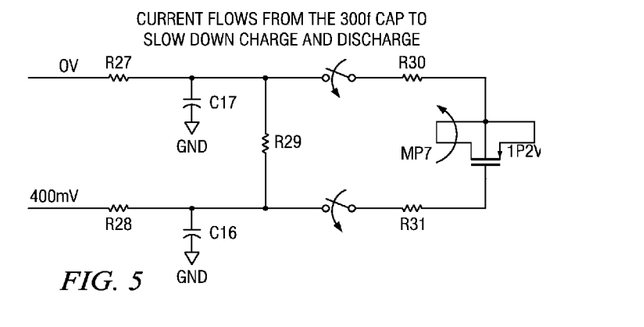
FIG. 5 illustrates an exemplary embodiment of the proposed scheme with a PMOS capacitor instead of a regular capacitor.
Figure 6:
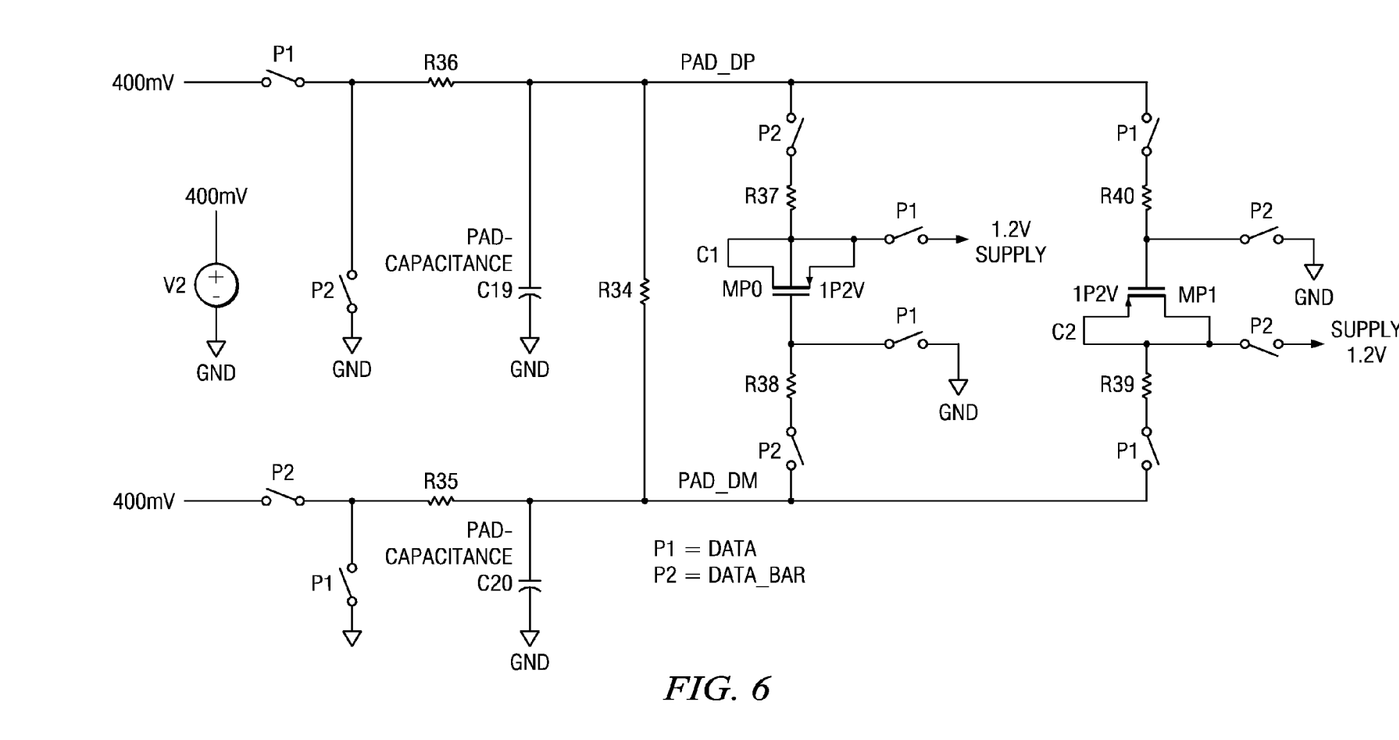
FIG. 6 illustrates a modified scheme for transition time control, using first and second PMOS capacitors C1 and C2.

Further, if a PMOS capacitance is used as shown in FIG. 5 instead of the capacitance illustrated in FIG. 4, the PMOS capacitance switches-off completely after the transition (because the final voltage across capacitance=−200 mV). Thus, after the transition, and hence for most of the bit-period, the high frequency reflection is not affected by the extra circuitry. It is also noted in the context of FIG. 5 that the resistance illustrated as RxTerm in FIG. 5 is the line impedance, which is typically the impedance of the transmission line, or the impedance of the interconnecting lines between the transmitter and the receiver. An exemplary complete circuit for a scheme using a PMOS capacitance is shown in FIG. 6. As shown, FIG. 6 includes two extra current paths one for high-to-low transition and the other for low-to-high transition. (Note: The bulk of the PMOS is shown to be connected to the source and drain. To reduce parasitics it is preferred to connect it to the 1.2V supply through a series resistance. To keep the figure simple, this connection is not shown in FIG. 6).

With further reference to FIG. 6, for a high-low transition, P1 is made 0 and P2 is made 1. PAD_DP is trying to discharge, PAD_DM is trying to charge while the charge of capacitance C1 flowing through the resistors R37 and R38 slows down the transition. In this phase, C2 is being pre-charged to 1.2V.

In FIG. 6, C1 is active only during transition and for the rest of the bit period it acts like an open circuit. This is because the voltage across it will be lower than its Vt. For a low-to-high transition, P2 becomes 1 and P1 becomes zero. In this mode the current through C2 slows down the transition, while C1 is pre-charged to 1.2V.

All switches illustrated herein for example are NMOS type (noting that the voltages involved are all less than 400 mV) and are controlled by 1.2V CMOS digital levels. Switches of other types may also be used instead. As illustrated, no controls other than DATA and DATA_BAR are required. This scheme illustrated in FIG. 6 does not rely on narrow control pulses. The fastest timing is the data transmission rate.

Further, the illustration in FIG. 6 shows an example of the present scheme which was implemented in the MIPI D-PHY compliant DSI (Display Serial Interface) transmitter operating at 800 Mbps with c021.m technology as an example only. It is noted that there are two voltage sources provided in the arrangement of FIG. 6, the first being the 400 mV voltage source which is useful in data transmission, the second being the 1.2V supply source which is not specifically shown in FIG. 6, but simply indicated as 1.2V supply.

Figure 7:
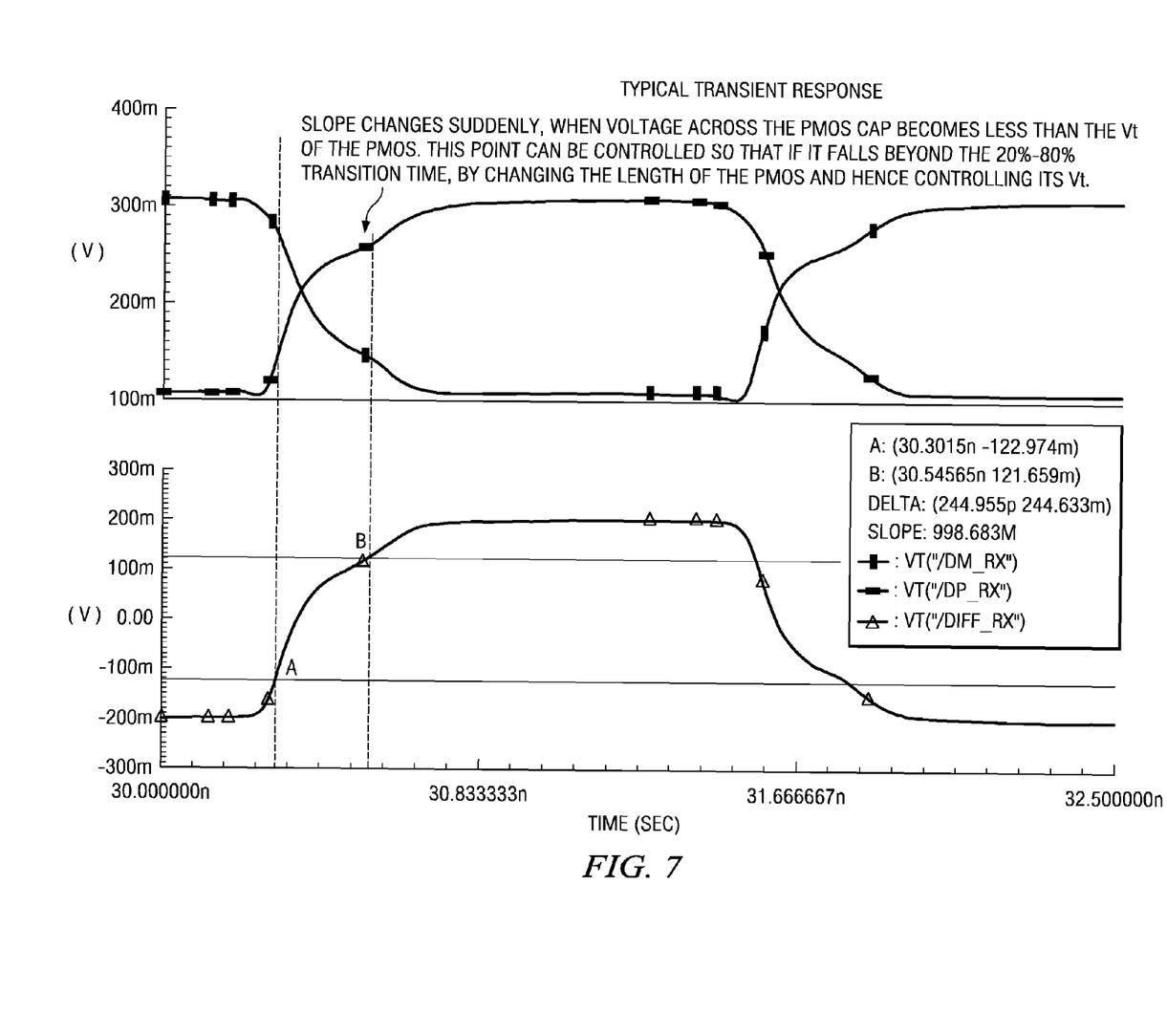
FIG. 7 illustrates a typical rise/fall time at the transmission pad after the present scheme is used.

FIG. 7 shows exemplary typical waveforms on the pad with a 50 Ohm internal termination, a 50 Ohm line and 1.5 pF capacitance on each pad. The 20%-80% rise time is 245 ps which is much better than the 70 ps which could be achieved without the use of the present scheme. Not counting the Y axis, there are two vertical lines seen in FIG. 7 which are parallel to the Y axis. At the intersection of the top graph with the second vertical line, the slope changes suddenly, when voltage across the PMOS capacitance becomes less than the Vt of the PMOS. This change point can be controlled so that it falls beyond the 20%-80% transition time, by changing the length of the PMOS and hence controlling its Vt.

Figure 8:
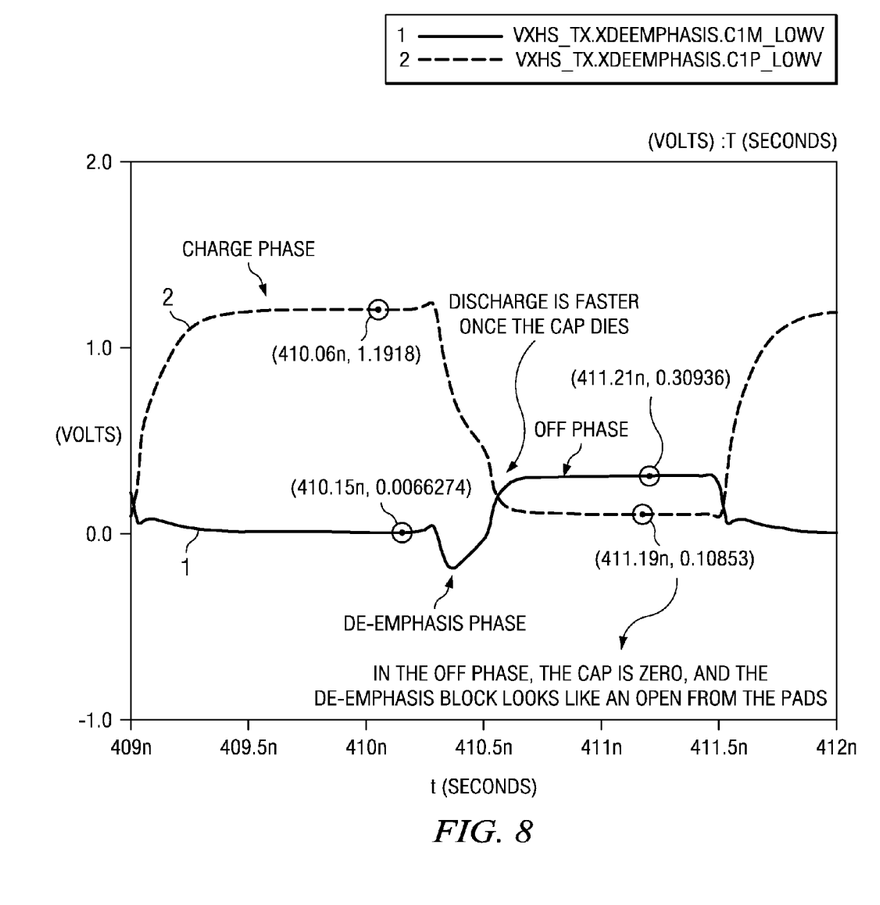
FIG. 8 shows the voltage levels at the terminals of capacitor C1 (from FIG. 6) in different phases; and, FIG. 9 illustrates the comparative output reflection with and without the use of the present scheme.

FIG. 8 shows the voltage across C1 in the two phases. In one phase C1 is charged to 1.2V. (In FIG. 6, P1=1 and P2=0 in this phase). In the other phase it is connected across the data lines (In FIG. 6, P1=0 and P2=1 in this phase), where it slowly discharges on to the pads during the transition. For the rest of the time, the capacitance remains off and does not impact the reflection on the lines.

Figure 9:
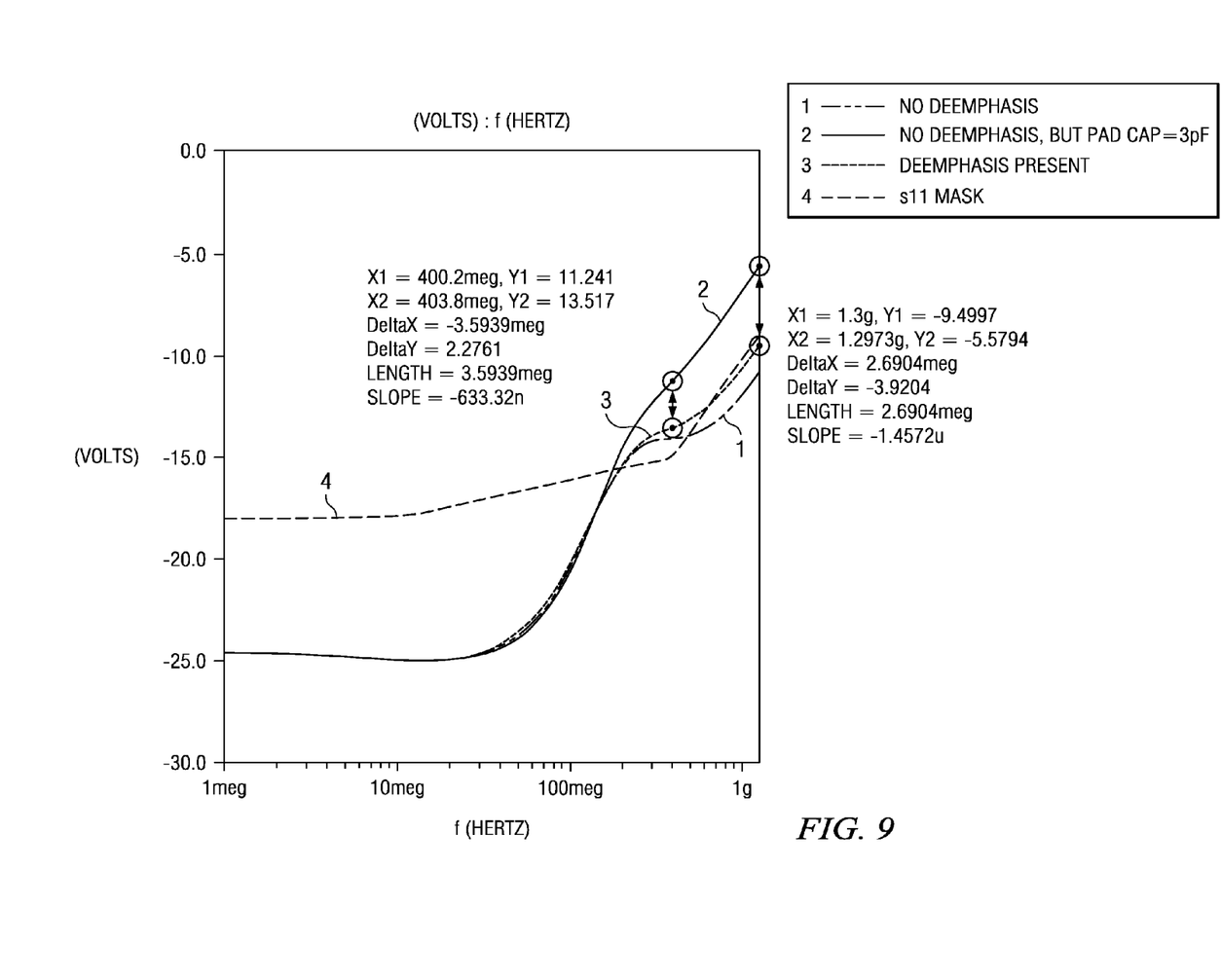

The D-PHY standard defines the output impedance in terms of the output reflection parameter on the transmitter ports, S11. The illustration in FIG. 9 shows that this parameter degrades slightly when this scheme (referred to as De-emphasis in the figure,) is used. This is because of the parasitics associated with the NMOS switches adding extra capacitance on the pads. However, if the present scheme were not used, then to slow down the transition times the pad capacitance would have to be 3 pF. As shown, in FIG. 9, this would have degraded the S11 quite significantly. Thus the present scheme effectively slows down the output transitions without significantly degrading the high-frequency output impedance of the transmitter. With further reference to FIG. 9, 's11 Mask' is the reflection specification as defined by the MIPI D-PHY standard. "De-emphasis present" refers to the case where the proposed scheme is used. "No De-emphasis but pad cap=3 pF" refers to the case where the proposed scheme is not used, but rather, a brute force method of slowing down transition by adding capacitance is used.

The solutions in prior art assume narrow current pulses to control output transition times. This requires extra complicated circuitry (for e.g. DLL—Delayed Lock Loop) to generate sub-100 ps timing from the original transmitter clock. Also, the scheme with the current pulses does not work at low signal common modes. The proposed scheme does not have such limitations. The proposed scheme does not require any additional controls and works on the DATA signal already present in the transmission. In this sense the present scheme is more economical.

It is also to be noted that in the present scheme, the die-area overhead is quite small (40 u*100 u in actual implementation), since the extra components are only a few, e.g., two capacitors, four resistors and core switches.

The proposed scheme inherently promotes differential behavior during transitions, noting that common mode does not change. It is noted however that in schemes using two different current sources such as shown in FIG. 2 for example, the differential nature will depend on the matching of the two currents sources.

The proposed scheme controls signal transition times in circuitry such as that associated with high speed transmitters, 1 . . . without requiring additional accurate control pulses.
 2 . . . even at low signal common-modes.
 3 . . . without affecting the reflection coefficient, S11, of the transmitter port.
 4 . . . is compact and does not take a lot of die area.
 5 . . . using only the DATA signal which is anyway available to the transmitter.

In the foregoing detailed description of embodiments of the invention, various features are grouped together in a single exemplary embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the detailed description of embodiments of the invention, with each claim standing on its own as a separate embodiment. It is understood that the above description is intended to be illustrative, and not restrictive. It is intended to cover all alternatives, modifications and equivalents as may be included within the spirit and scope of the invention as defined in the appended claims. Many other embodiments will be apparent to those of skill in the art upon reviewing the above description. The scope of the invention should therefore be determined with reference to the appended claims, along with the full scope of equivalents to which such claims are entitled. In the appended claims, the terms "including" and "in which" where present, are used as the plain-English equivalents of the respective terms "comprising" and "wherein," respectively. Moreover, the terms "first," "second," and "third," etc., where present, are used merely as labels, and are not intended to impose numerical requirements on their objects.

The invention claimed is:

1. In a transmitter pad system using a transmitter voltage source and interacting with a serial interface of the type using a voltage/current mode driver wherein a line-impedance exists across the transmitter voltage source, a method for controlling transmitter rise-fall transitions to selectively speed up or slow down said transitions, comprising:
   using at least one pre-charged capacitor connected through resistor-like elements and switches across said line-impedance to cooperate with said transmitter pad system to selectively speed up or slow down said transmitter rise-fall transitions, wherein there are two transmitter pads, wherein said pre-charged capacitor includes first and second PMOS capacitors connected in parallel with controllable switches and configured such that when said first PMOS capacitor is connected for one of said rise-fall transitions, the second PMOS capacitor is connected between a suitable voltage supply and ground for getting pre-charged, and vice versa.

2. The method as in claim 1, wherein the serial interface interacts with at least two nodes, wherein said pre-charged capacitor comprises a capacitor ensuring differential behavior such that current taken away from one node equals current pumped into the other node.

3. The method as in claim 1 wherein a current caused by discharge of the capacitor flows into said transmitter pad when it tries to discharge, and flows out of the pad when the transmitter pad tries to charge, resulting in slowing down transition.

4. The method as in claim 3 wherein said current caused by discharge of the capacitor opposes currents flowing from said voltage source, till said capacitor is fully discharged.

5. The method as in claim 1, wherein current flows into the pad when the pad is trying to discharge, resulting in speeding up transition.

6. The method as in claim 5 including a configuration for isolating the capacitor through one or more series resistors or resistor-like elements.

7. The method as in claim 1 wherein said pre-charged capacitor comprises a PMOS (Positive Channel MOS) capacitor.

8. The method as in claim 1 wherein said controllable switches comprise NMOS switches controlled by CMOS digital levels.

9. The method as in claim 1 implemented in a MIPI D-PHY compliant DSI (Display Serial Interface) transmitter operating for example at 800 Mbps, wherein said line-impedance is 50 ohms and each of first and second PMOS capacitors is 1.5 pfs.

10. In a transmitter pad system circuitry using a serial interface wherein the transmitter pad system circuitry includes a voltage source and has a differential line impedance existing across said voltage source, a scheme for controlling transmitter rise-fall transitions without requiring additional timing controls, comprising: at least one pre-charged capacitor interacting with the transmitter pad and connected across the differential line impedance through resistor-like elements and at least one switch, to selectively speed up or slow down said transmitter rise-fall transitions, wherein there are two transmitter pads, wherein said capacitor includes first and second PMOS capacitors connected in parallel with controllable switches, said scheme being configured such that when said first PMOS capacitor is connected for one of said rise-fall transitions, the second PMOS capacitor is connected between a suitable voltage supply and ground for getting pre-charged, and vice versa.

11. The scheme as in claim 10, wherein the serial interface interacts with at least two nodes, wherein said pre-charged capacitor comprises a capacitor ensuring differential behavior such that current taken away from one node equals current pumped into the other node.

12. The scheme as in claim 10 wherein a current caused by discharge of the capacitor flows into said transmitter pad when it tries to discharge, and flows out of the pad when the transmitter pad tries to charge, resulting in slowing down transition.

13. The scheme as in claim 12 wherein said current caused by discharge of the capacitor opposes currents flowing from said voltage source, till said capacitor is fully discharged.

14. The scheme as in claim 10, wherein current flows into the pad when the pad is trying to discharge, resulting in speeding up transition.

15. The scheme as in claim 14 including a configuration for selectively isolating the capacitor through one or more series resistors or resistor-like elements.

16. The scheme as in claim 10 wherein said pre-charged capacitor comprises a PMOS (Positive Channel MOS) capacitor.

17. The scheme as in claim 10 wherein said controllable switches comprise NMOS switches controlled by CMOS digital levels.

18. The scheme as in claim 10 implemented in a MIPI D-PHY compliant DSI (display Serial Interface) transmitter operating for example at 800 Mbps, wherein said line-impedance is of the order of 50 ohms and each of first and second PMOS capacitors is of the order of 1.5 pfs.

19. In a serial interface pad system arrangement conforming to D-PHY standard and used with a transmitter pad, wherein the transmitter pad is connected across a voltage source and is influenced by a differential line impedance reckoned across said voltage source, a scheme for controlling transmitter rise-fall transitions, comprising:
   providing a first current path having a first controllable switch and including a first PMOS capacitor for differential rise to fall transition; and,
   providing a second current path having a second controllable switch and including a second PMOS capacitor for differential fall to rise transition, said first and second PMOS capacitors being pre-charged and connected in parallel across said voltage source through resistor-like elements, said scheme being configured such that when said first PMOS capacitor is connected for one of said rise-fall transitions, the second PMOS capacitor is connected between a suitable voltage supply and ground for getting pre-charged, and vice-versa.

20. In a chip where signal transition is involved and where the signal transition occurs across a voltage source and is influenced by a differential impedance reckoned across said voltage source, a scheme for controlling signal rise-fall transitions, comprising:

providing a first current path having a first controllable switch and including a first PMOS capacitor for differential rise to fall transition; and, providing a second current path having a second controllable switch and including a second PMOS capacitor for differential fall to rise transition, said first and second PMOS capacitors being pre-charged and connected in parallel through resistor-like elements across said differential impedance, said scheme being configured such that when said first PMOS capacitor is connected for one of said rise-fall transitions, the second PMOS capacitor is connected between a suitable voltage supply and ground for getting pre-charged, and vice versa.

* * * * *